United States Patent [19] [11] Patent Number: 4,888,546
Berry et al. [45] Date of Patent: Dec. 19, 1989

[54] DEVICE FOR MEASURING SEAM RESISTANCE

[75] Inventors: Mark D. Berry, Columbia; Henry C. Brisker, Silver Spring; Andrew A. Cuneo, Jr., Towson, all of Md.

[73] Assignee: The United States of America as represented by the Secretary of the Army, Washington, D.C.

[21] Appl. No.: 322,391

[22] Filed: Mar. 10, 1989

[51] Int. Cl.$^4$ ............................................. G01R 27/14
[52] U.S. Cl. ....................................... 324/64; 324/65 P
[58] Field of Search ............ 324/64, 65 P, 127, 158 P, 324/149

[56] References Cited

U.S. PATENT DOCUMENTS

| | | | |
|---|---|---|---|
| 1,895,643 | 1/1933 | Putnam | 324/64 |
| 2,440,044 | 4/1948 | Greenslade | 324/64 |
| 4,335,350 | 6/1982 | Chen | 324/64 |
| 4,667,149 | 5/1987 | Cohen et al. | 324/64 |

OTHER PUBLICATIONS

Andrew A. Cuneo, Jr. and Henry C. Brisker, "Hemp Experimental Investigations for Facilitization of the S-658 ()/G Hardened Shelter, Phase 1", Sep. 1986.
IBM Technical Disclosure, "Area Probe Alignment Technique", vol. 22, No. 3, 8/79, Hassing et al.

Primary Examiner—Reinhard J. Eisenzopf
Assistant Examiner—Maura K. Regan
Attorney, Agent, or Firm—Saul Elbaum

[57] ABSTRACT

A portable seam resistance measuring apparatus having a housing with one or more flat exterior surfaces, a number of apertures, an indicator at the midpoint of the flat surface, two or more current injection probes, two or more voltage injection probes, a mechanical bias on the probes, a number of connectors, an electrical current through two probes and voltage measurement through two probes is disclosed. The device is used to measure the voltage drop across the seam of a wall enabling the resistance of the seam to be calculated.

12 Claims, 4 Drawing Sheets

DEVICE FOR MEASURING SEAM RESISTANCE

RIGHTS OF THE GOVERNMENT

The invention described herein may be manufactured, used and licensed by or for the United States Government for Governmental purposes without payment to us of any royalty thereon.

BACKGROUND OF THE INVENTION

1. Field of the Invention

The present invention is related to resistance measuring devices and, more particularly, is directed towards a novel structure designed for ease of measurement of the resistance of a seam in a shelter used for electromagnetic shielding purposes.

2. Description of the Prior Art

Army shelters are built with walls made from metal or metal covered composites for shielding, and support. The shielding is designed to assure the electromagnetic and nuclear survivability of critical command, control and communications electronic warfare sheltered systems. These metal walls are usually joined either by bolts or welding. The resulting seams between the metal walls have a measurable resistance. Seam resistance is important in that it is a measure of the shielding effectiveness of the shelter. If the shelter is subject to high electric and magnetic fields, currents will be developed on the outside walls and those currents may encounter a seam. If the seam has a high resistance (due to damage, oxidation, age degradation or uneven torque on the seam bolts), a large voltage will be developed across the seam and energy will be radiated into the shelter. If the shelter contains electronic equipment, the radiated energy could couple into the electronic equipment and cause considerable damage.

The coupling through seams is reasonably well understood theoretically. The open circuit voltage, $V_s(t)$ developed across the seam is related to the surface current density, $J_s(t)$, flowing normal to the seam by the time domain expression:

$$V_s(t) = [R_s + L_s \partial_t^3] J_s(t)$$

where $R_s$ and $L_s$ are the transfer resistance and inductance in units of ohms-m and henries-m, respectively. In the frequency domain, the equation becomes:

$$V_s(\omega) = Z_T(\omega) J_s(\omega)$$

where $Z_T(\omega)$ is commonly referred to as the seam transfer impedance.

The magnetic polarizability per unit length, m, is related to the seam inductance, $L_s$, by $$L_s = \mu_o m$$

where $\mu_o$ is the permeability of free space.

Using the transfer impedance concept, the electric field, $E_s$, developed across the seam is given by $$E_s = \frac{Z_T J_s}{a}$$

where a is the width of the seam. This is then the electric field at the seam which is needed to calculate the electromagnetic field in the half-space behind the infinite conducting plane having the seam. Thus, the development of the seam theory assumes that there is no cavity of finite size behind the seam.

In the prior art, the method used for determining seam resistance was cumbersome. Two probes for injecting a current surface density $J_s$ were attached to the wall on either side of the seam. Two additional probes for measuring the open circuit voltage $V_s$ developed across the seam were also attached to either side of the seam. These probes were then moved up and down the length of the seam in order to characterize the resistance of the entire seam. However, because the position of the probes on either side of the seam would vary somewhat in relation to the seam and each other at each reading, error was introduced into the overall characterization. Additional error was introduced because of the varying pressure on the current probes as they were held to the wall only by tape. Also, because the relative distance between the current probes and the voltage probes did not remain constant, further error was encountered. The prior art method also required several operators to conduct these measurements.

It therefore may be appreciated that there is a great need for a portable seam resistance measuring apparatus that will facilitate repeatable measurements and be operable by one individual.

OBJECTS AND SUMMARY OF THE INVENTION

It is therefore a primary object of the invention to provide a portable seam resistance measuring apparatus which allows for ease of measuring the resistance of a seam in a structure.

Another object of this invention is to reduce the error in seam resistance measurements by maintaining a constant distance between the current injection probes and the voltage injection probes, and a constant distance between each voltage probe and the seam on either side of the seam.

A still further object of this invention is to reduce the error in seam resistance measurement by maintaining a constant pressure on the current and voltage injection probes as they are positioned against the shelter wall.

This invention incorporates in a compact, hand-held unit, the voltage and current injection probes which previously had to be taped to a shelter wall. By the use of a spring behind each probe, a constant pressure is exerted on each probe as the unit is positioned against the shelter wall. Internal wiring connects each probe to a connector on the outside of the insulated housing. One pair of connectors connects the current injection probes to a source of high (up to 10 amps) current. A second pair of connectors connects the voltage injection probes to a sensitive (micro-volts) digital voltage meter. An additional connector allows for the measurement of the current through the current injection probes.

DETAILED DESCRIPTION OF THE PREFERRED EMBODIMENTS

Figure 1:
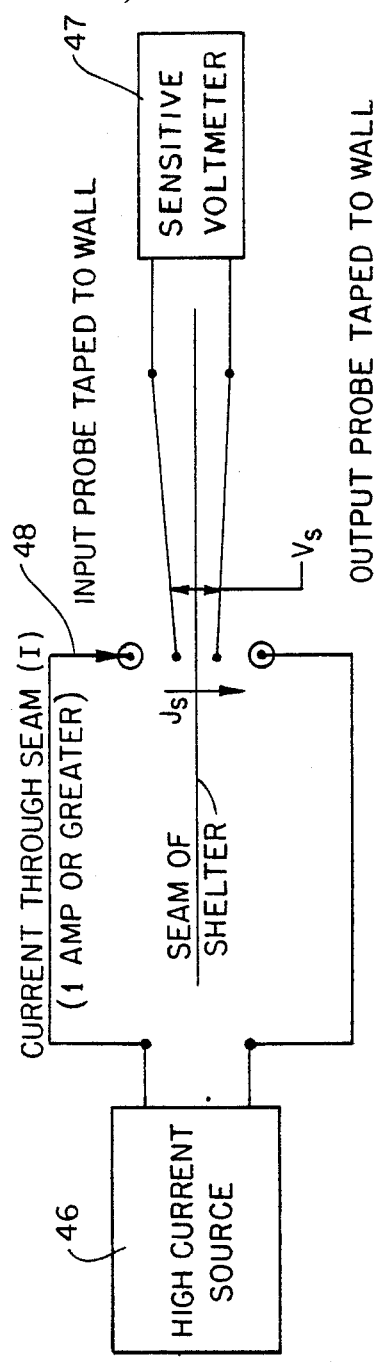
FIG. 1 shows a picture illustrative of the prior art.

FIG. 1 shows schematically a method used prior to this invention for measuring both seam transfer resistance and seam resistance. In prior techniques a surface currenty density, $J_s$, was made to flow across the seam. This current density developed a voltage, $V_s$, across the seam which was measured by a sensitive voltmeter 47. $J_s$ was developed by directly connecting the output of a high current source 46 to the inside shelter wall by means of a cable 48 with a probe on the end taped to the shelter wall. The voltage across the seam $V_s$, measured by the sensitive voltmeter 47 along with the surface current density $J_s$ were used to calculate the seam transfer impedance.

Figure 2:
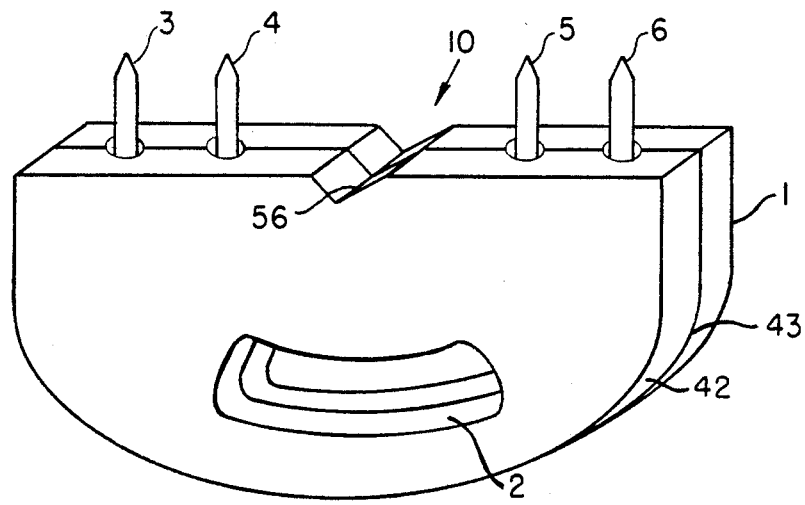
FIG. 2 shows an isometric view of a portable seam resistance measuring apparatus according to an embodiment of the present invention.

Referring now to FIG. 2 there is illustrated a portable seam resistance measuring device 10 comprising a lower housing 1, an upper housing 42, a handle 2, an input current injection probe 3, an input voltage injection probe 4, an output voltage injection probe 5 and an output current injection probe 6. The lower housing 1 is securely fastened to the upper housing 42 by gluing or other suitable means forming seam 43. Both the upper housing 42 and the lower housing 1 are made of a non-conducting material such as plastic. An indentation 56 is provided midway between the input voltage injection probe 4 and the output voltage injection probe 5 which allows the portable seam resistance measuring device 10 to be positioned correctly over the seam, that is, when the indentation 56 is placed directly over the seam, the input voltage injection probe 4 and the output voltage injection probe 5 will be equidistant from the seam. Likewise, because the input current injection probe 3 is a fixed distance from the input voltage injection probe and the output current injection probe 6 is a fixed distance from the output voltage injection probe 5, the input current injection probe 3 and the output current injection probe 6 will be equidistant from the seam.

Figure 3:
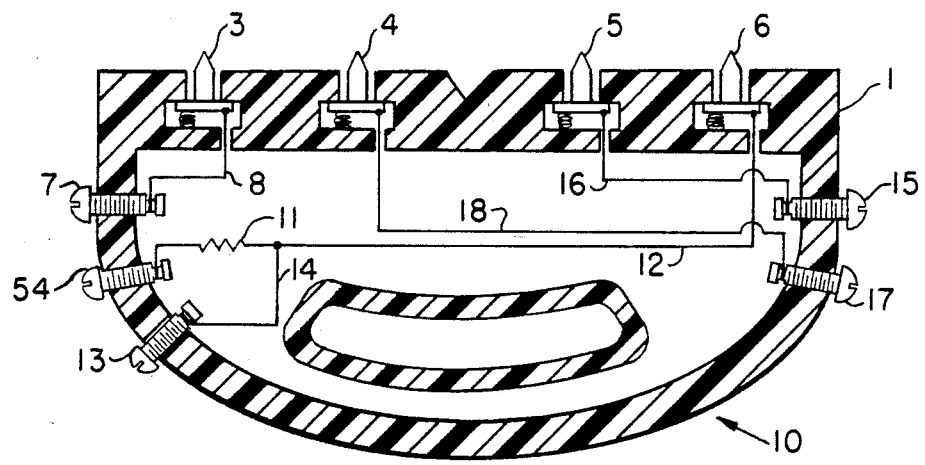
FIG. 3 is a sectional view and shows the interior of the apparatus of FIG. 2.
Figure 5:
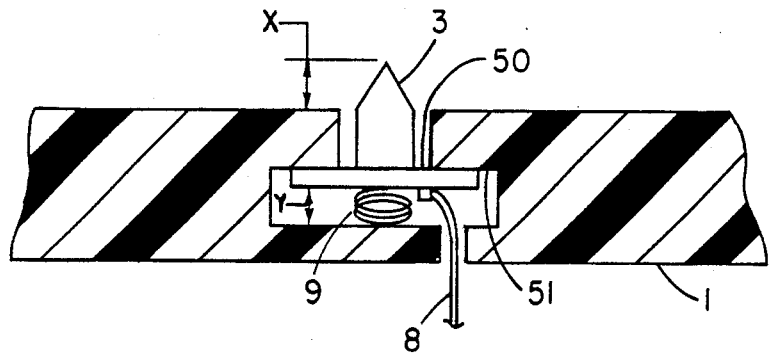
FIG. 5 shows a detail of one of the injection probes.

FIG. 3 shows the interior portion of the seam resistance measuring apparatus from section 2—2 of FIG. 2. The lower housing 1 contains the probes, wires and connectors. The input current injection probe 3 is connected to the current input connector 7 by wire 8. The current input connector 7 is a screw type connector upon which wire 8 is fastened by solder or other suitable means. As shown in FIG. 5, wire 8 is routed through housing 1 and fastened to the bottom of input current injection probe 3 by solder. The flange 50 of the input current injection probe 3 is held firmly against the input current injection probe upper interior cavity surface 51 by spring 9.

Referring back to FIG. 3, the current output connector 54 is connected to a 1 ohm resistor 11 which is then connected by wire 12 to the output current injection probe 6. The current measuring connector 13 is connected to wire 12 by wire 14. Wires 8, 12, 14 and resistor 11 must be heavy enough to withstand up to 10 amperes of current. The voltage output connector 15 is connected by wire 16 to the output voltage injection probe 5 and the voltage input connector 17 is connected by wire 18 to the input voltage injection probe 4.

Figure 8:
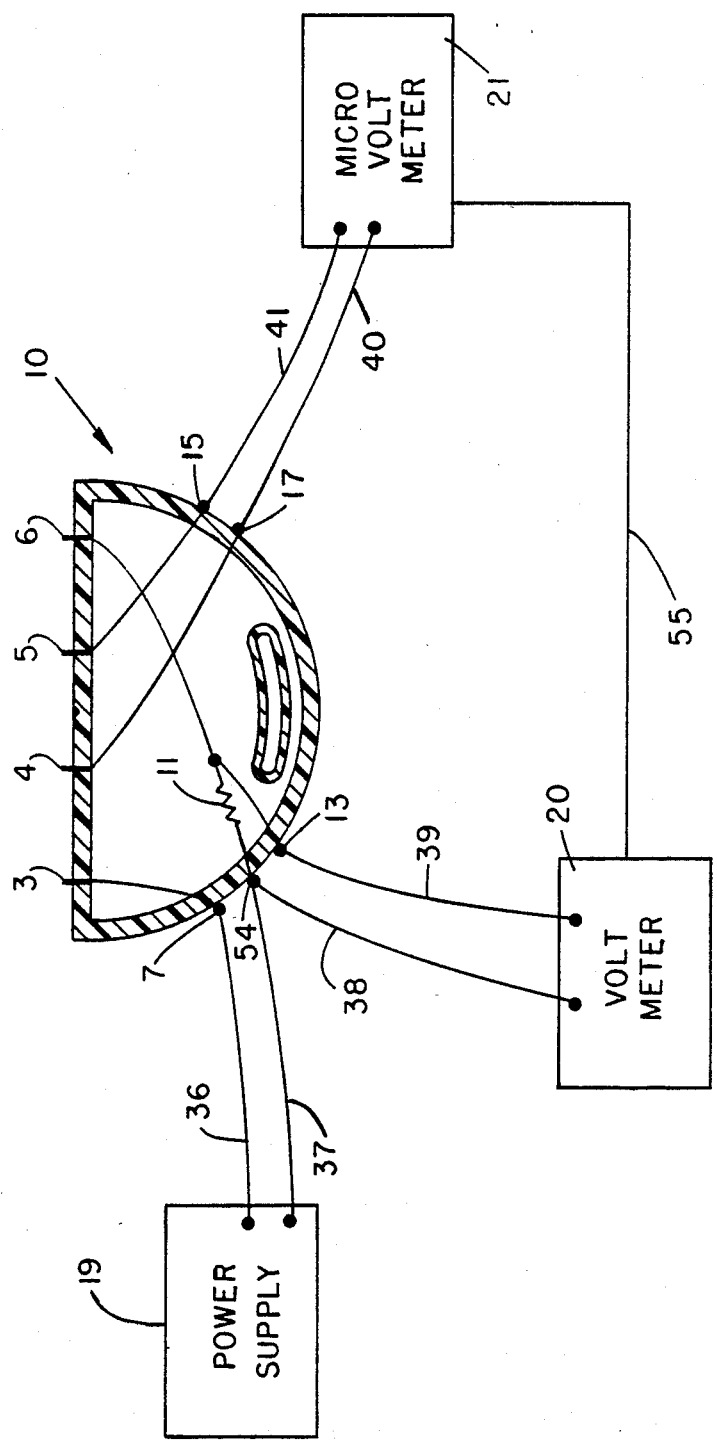
FIG. 8 shows a picture illustrative of how the apparatus of FIG. 2 is connected to external devices.

FIG. 8 shows the connection of the seam resistance measuring device 10 to three additional external items. A power supply 19 capable of providing up to 10 amperes current is connected by wire 36 to the current input connector 7 and by wire 37 to the current output connector 54. Power supply 19 is used to supply a current that will be injected into one side of a seam through the input current injection probe 3 and will return from the other side of the seam through the output current injection probe 6. A volt meter 20 is connected to the current output connector 54 by wire 38 and to the current mesuring connector 13 by wire 39 and is used to measure the voltage drop across resistor 11. Because resistor 11 is one ohm, the voltage shown by volt meter 20 converts directly to the current passing through resistor 11. A micro-volt meter 21 is connected to the voltage output connector 15 by wire 41 and to the voltage input connector 17 by wire 40 and is used to measure the voltage between the input voltage injection probe 4 and the output voltage injection probe 5. This voltage will equal the voltage across the seam because the input voltage injection probe 4 is on one side of the seam and the output voltage injection probe 5 is on the other side of the seam. The seam resistance can then be calculated using the equation $R = V/I$ where $V =$ the voltage across the seam, $I =$ the current injected and $R =$ the seam resistance. By using a micro volt meter 21 capable of performing internal calculations, the seam resistance can be directly read from the micro volt meter 21 if the output from volt meter 20 is fed into the micro volt meter 21 through cable 55.

Figure 6:
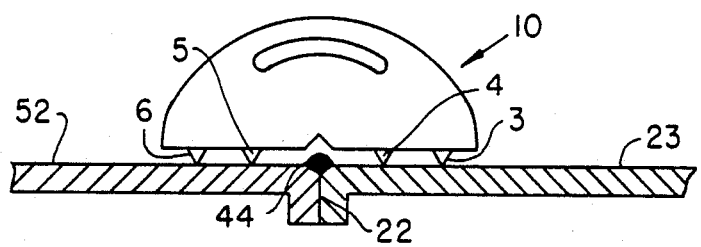
FIG. 6 shows a picture illustrative of how the apparatus of FIG. 2 may be operated.

Positioning of the seam resistance measuring device 10 is shown in FIG. 6. In this case, interior wall 52 and interior wall 23 are joined with resulting seam 22 closed by weld 44. The device 10 is placed over seam 22 such that the input current injection probe 3 and the input voltage injection probe 4 are on one side of seam 22 with the output voltage injection probe 5 and the output current injection probe 6 on the other side of seam 22. When the seam resistance measuring device 10 is positioned flat against interior walls 52 and 23, the input current injection probe 3 will fully retract into the housing because the exterior height "x" of the probe (shown in FIG. 5) is less than the interior cavity height "y" (also shown in FIG. 5). Spring 9 will tend to force the input current injection probe 3 back against the interior wall 23, and will exert just enough force to insure prope contact. In a similar fashion, the input voltage injection probe 4, output voltage injection probe 5 and output current injection probe 6 will be positioned. With the device 10 configured as show in FIG. 8, current is injected and measurements made. The device is moved up and down seam 22 until enough readings are taken to characterize the seam resistance.

Figure 4:
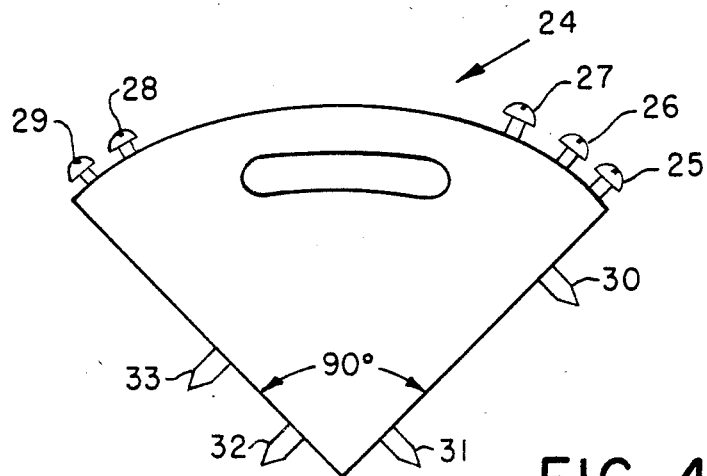
FIG. 4 shows a front view of a portable seam resistance measuring apparatus according to another embodiment of the present invention.
Figure 7:
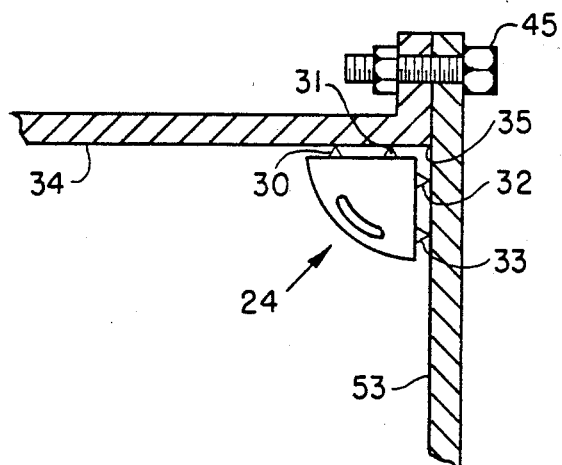
FIG. 7 shows a picture illustrative of how the apparatus of FIG. 4 may be operated.

Another embodiment of the present invention is shown in FIG. 4. In this embodiment the input current injection probe 30 of the seam resistance measuring device 24 is offset 90 degrees from the output current injection probe 33. Similarly, the input voltage injection probe 31 is offset 90 degrees from the output voltage injection probe 32. The angle of offset may be varied to accommodate different types of interior shelter corners; typically the angle of offset will be between 70 degrees and 110 degrees. The current input connector 25, current output connector 26, current measuring connector 27, voltage input connector 28 and voltage output connector 29 function in the same manner as those shown in FIG. 3. Use of seam resistance measuring device 24 is shown in FIG. 7. In this case, interior wall 34 and interior wall 53 are joined with resulting seam 35 closed by bolt 45. The device is placed in the corner of these interior walls such that the input current injection probe 30 and the input voltage injection probe 31 are on one side of seam 35 with the output voltage injection probe 32 and the output current injection probe 33 on the other side of seam 35. With the device 24 configured as show in FIG. 8, current is injected and measurements made. The device is moved up and down seam 35 until enough readings are taken to characterize the seam resistance.

To those skilled in the art, many modifications and variations of the present invention are possible in light of the above teachings. It is therefore to be understood that the present invention can be practiced otherwise than as specifically described herein and still will be within the spirit and scope of the appended claims.

We claim:

1. A portable seam resistance measuring apparatus comprising:
   a housing having at least one flat exterior surface;
   a plurality of apertures located on said flat exterior surface;
   a v-shaped indicator located at the midpoint of said flat exterior surface such that placing said v-shaped indicator over a seam between two metallic wall panels centers said flat exterior surface over said seam;
   at least two current injection probes located within two of said apertures with at least one of said current injection probes on either side of said v-shaped indicator;
   at least two voltage injection probes located within two of said apertures with at least one of said voltage injection probes on either side of said v-shaped indicator;
   means for causing said current injection probes and said voltage injection probes to extend a fixed distance above said flat exterior surface and to retract flush with said flat exterior surface when subjected to an external inward force;
   a plurality of connectors attached to the outside of said housing;
   means for supplying an electrical current through a pair of said connectors to said current injection probes;
   means for measuring said current;
   means for measuring the voltage between said voltage injection probes whereby the resistance of a seam between two metallic wall panels can be calculated.

2. The device of claim 1 wherein the means for causing said current injection probes and said voltage injection probes to extend a fixed distance above said flat exterior surface and to retract flush with said flat exterior surface when subjected to an external inward force is a spring.

3. The device of claim 1 wherein said voltage injection probes are located equidistant on either side of said v-shaped indicator.

4. The device of claim 1 wherein said current injection probes are located equidistant on either side of said voltage injection probes.

5. The device of claim 1 wherein said housing is made of a nonconducting material.

6. The device of claim 1 further comprising:
   means for connecting said current measuring means to said voltage measuring means whereby the resistance of a seam between two metallic wall panels is automatically calculated by said voltage measuring means.

7. A portable seam resistance measuring apparatus comprising:
   a housing having at least two flat exterior surfaces, wherein the angle formed at the intersection of said first flat exterior surface and said second flat exterior surface is 90 degrees;
   a plurality of apertures located on said first and second flat exterior surfaces;
   at least two current injection probes located within two of said apertures, with at least one current injection probe on said first flat exterior surface and at least one current injection probe on said second flat exterior surface;
   at least two voltage injection probes located within two of said apertures, with at least one voltage injection probe on said first flat exterior surface and at least one voltage injection probe on said second flat exterior surface;
   means for causing said current injection probes and said voltage injection probes to extend a fixed distance above said flat exterior surfaces and to retract flush with said flat exterior surfaces when subjected to an external inward force;
   a plurality of connectors attached to the outside of said housing;
   means for supplying an electrical current through a pair of said connectors to said current injection probes;
   means for measuring said current;
   means for measuring the voltage between said voltage injection probes whereby the resistance of a seam can be calculated.

8. The device of claim 7 wherein the means for causing said current injection probes and said voltage injection probes to extend a fixed distance above said flat exterior surfaces and to retract flush with said flat exterior surfaces when subjected to an external inward force is a spring.

9. The device of claim 7 wherein said voltage injection probes are located equidistant on either side of the intersection of said first exterior surface and said second exterior surface.

10. The device of claim 7 wherein said current injection probes are located equidistant on either side of said voltage injectio probes.

11. The device of claim 7 wherein said housing is made of a nonconducting material.

12. The device of claim 7 further comprising:
   means for connecting said current measuring means to said voltage measuring means whereby the resistance of a seam is automatically calculated by said voltage measuring means.

* * * * *